(12) United States Patent
Li

(10) Patent No.: US 9,887,362 B2
(45) Date of Patent: Feb. 6, 2018

(54) PENTACENE ACTIVE LAYER AND A METHOD FOR PREPARING THE SAME

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventor: Hongpeng Li, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/070,892

(22) Filed: Mar. 15, 2016

(65) Prior Publication Data

US 2017/0012210 A1    Jan. 12, 2017

(30) Foreign Application Priority Data

Jul. 7, 2015   (CN) .......................... 2015 1 0394375

(51) Int. Cl.

| | |
|---|---|
| *H01L 51/00* | (2006.01) |
| *G03F 7/16* | (2006.01) |
| *G03F 7/20* | (2006.01) |
| *G03F 7/32* | (2006.01) |
| *G03F 7/40* | (2006.01) |
| *H01L 51/05* | (2006.01) |

(52) U.S. Cl.
CPC .......... *H01L 51/0055* (2013.01); *G03F 7/168* (2013.01); *G03F 7/20* (2013.01); *G03F 7/32* (2013.01); *G03F 7/40* (2013.01); *H01L 51/0003* (2013.01); *H01L 51/004* (2013.01); *H01L 51/0018* (2013.01); *H01L 51/0026* (2013.01); *H01L 51/0558* (2013.01)

(58) Field of Classification Search
CPC ............... H01L 51/0055; H01L 51/004; H01L 51/0003; H01L 51/0018; H01L 51/0026; H01L 29/04
See application file for complete search history.

(56) References Cited

U.S. PATENT DOCUMENTS

| | | | | |
|---|---|---|---|---|
| 2004/0119073 | A1* | 6/2004 | Ardakami | ........... H01L 51/0055 257/72 |
| 2008/0197325 | A1 | 8/2008 | Leeming et al. | |
| 2014/0084282 | A1* | 3/2014 | Cao | ..................... H01L 29/7869 257/43 |

FOREIGN PATENT DOCUMENTS

| | | |
|---|---|---|
| CN | 1845354 A | 10/2006 |
| CN | 1856196 A | 11/2006 |

OTHER PUBLICATIONS

Second Office Action regarding Chinese Application No. 201510394375.5, dated Aug. 1, 2017. Translation provided by Dragon Intellectual Property Law Firm.
First Office Action regarding Chinese Application No. 201510394375.5, dated Apr. 5, 2017. Translation provided by Dragon Intellectual Property Law Firm.
Zhou-Long Lin et al., "Synthesis of a Soluble Hexacene Derivative for Organic Thin-Film Transistors," Jun. 2014.

* cited by examiner

*Primary Examiner* — Kyoung Lee
*Assistant Examiner* — Christina Sylvia
(74) *Attorney, Agent, or Firm* — Harness, Dickey & Pierce, P.L.C.

(57) ABSTRACT

The present invention discloses an active layer and a method for preparing the same, an organic field-effect transistor and an array substrate. In the method for preparing an active layer according to the invention, the active layer is pentacene layer, wherein the pentacene layer is prepared by a compound of the following Formula I as a precursor of pentacene. The active layer of the invention is prepared by the preparation method of the invention; the organic field-effect transistor of the invention includes the active layer of the invention; and the array substrate of the invention includes the organic field-effect transistor according to the invention.

Formula I

14 Claims, No Drawings

PENTACENE ACTIVE LAYER AND A METHOD FOR PREPARING THE SAME

CROSS-REFERENCE TO RELATED APPLICATION

The present application claims priority to the Chinese patent Application No. 201510394375.5 filed in China on Jul. 7, 2015, the entire contents of which are incorporated by reference.

FIELD OF THE INVENTION

The present invention relates to the field of display panels, and in particular, to an active layer and a method for preparing the same, an organic field-effect transistor and an array substrate.

BACKGROUND

Organic field-effect transistor is a semiconductor device that employs an organic semiconductor material to replace the traditional silicon semiconductor material as the active layer, and it may be applied to the field of flexible displays.

Organic semiconductor materials that may be used for manufacturing an active layer include: metal complex-type, polymer-type, hybridized type and micromolecule-type materials. Preferably, the organic semiconductor material for the active layer of an organic field-effect transistor is a micromolecule-type material, and more preferably, pentacene. This is because that, when pentacene is employed in place of silicon semiconductor material as an active layer, the mobility of the organic field-effect transistor may reach or even exceed the mobility of the transistor that employs traditional silicon semiconductor material as an active layer.

At present, a pentacene layer that functions as an active layer is generally manufactured by a wet process of printing a pentacene precursor and then heating directly. However, since a solvent may volatilize during the wet process, a coffee ring may be formed on the pentacene layer, so that the optical property of an organic field-effect transistor that includes the pentacene layer will be influenced. In addition, the presence of the solvent makes the pentacene layer have flowability, thus the size and shape of the pentacene layer prepared will be changed, and the precision of the active layer will be influenced.

During experiments, the inventors find that, if a photoetching process is employed to form the pentacene layer, the above problem may be overcome. But at present, the pentacene precursor does not contain ultraviolet reactive groups, thus the pentacene layer cannot be prepared by a photoetching process.

SUMMARY

The present invention provides a method for preparing an active layer of an organic field-effect transistor, thereby solving the problem of the prior art that a pentacene precursor cannot be employed to prepare a pentacene layer as an active layer via a photoetching process. Additionally, the invention further provides an organic field-effect transistor and an array substrate which comprises the active layer prepared by the above method.

According to one aspect of the invention, there provides a method for preparing an active layer, wherein the active layer is a pentacene layer, which is prepared by a compound of Formula I as a precursor of pentacene

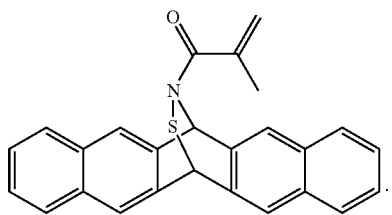

Formula I

Optionally, the preparation method according to the invention includes:

coating step: coating a solution of a compound of Formula I to form a layer, and then drying;

photoetching step: coating a photoresist on the layer of the compound of Formula I obtained in the coating step, providing a mask plate and exposing, wherein the compound of Formula I in the exposed region is converted into a polymer of Formula II;

developing step: developing the polymer of Formula II via an organic solvent after peeling off the photoresist, and washing out the compound of Formula I in the unexposed region; and pentacene generating step: heating the polymer of Formula II in the exposed region to convert it into pentacene;

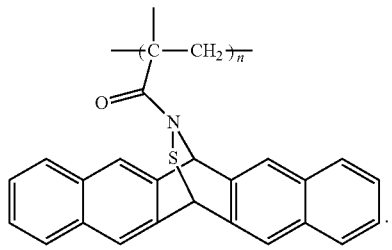

Formula II

Optionally, in the coating step of the preparation method according to the invention, the mass percentage concentration of the solution of the compound of Formula I is 1.5~2.5%.

Optionally, in the coating step of the preparation method according to the invention, the solvent of the solution of the compound of Formula I is a mixed solvent, wherein, the mixed solvent includes, by weight, 10~14 parts of ethylene glycol monobutyl ether, 70~74 parts of γ-butyrolactone and 14~18 parts of N-methyl pyrrolidone.

Optionally, in the coating step of the preparation method according to the invention, the drying temperature is in the range from 90 to 100° C., and the drying time is in the range from 98 to 102 seconds.

Optionally, in the photoetching step of the preparation method according to the invention, the exposure wavelength is in the range from 300 to 450 nm, and the light quantity accumulated on an area of one square centimeter is in the range from 70 to 130 MJ.

Optionally, in the developing step of the preparation method according to the invention, the organic solvent is trichloromethane, tetrahydrofuran or dioxane.

Optionally, in the pentacene generating step of the preparation method according to the invention, the heating temperature is in the range from 175 to 185° C., and the heating time is in the range from 15 to 25 minutes.

According to another aspect of the invention, there provides an active layer obtained according to the preparation method of the invention.

According to still another aspect of the invention, there provides an organic field-effect transistor, which includes the active layer of the invention.

According to still another aspect of the invention, there provides an array substrate, which includes the organic field-effect transistor of the invention.

The invention has the following advantageous effects:

In the method for preparing an active layer according to the invention, since a compound of Formula I is employed as a precursor, an active layer may be prepared by a photoetching method, thereby the coffee ring caused by a wet process of the prior art may be avoided, and the optical performance of the organic field-effect transistor may be improved. Additionally, for the active layer obtained by the preparation method according to the invention, the problem may be avoided that shape and size of the pentacene layer tend to be changed due to the flowability of the pentacene layer with a solvent obtained via a wet process, and the precision of the pentacene layer may be improved.

DETAILED DESCRIPTION

The specific embodiments are only used for explaining and illustrating the invention, rather than limiting the content thereof. The invention will be further illustrated and described below in conjunction with specific embodiments.

According to one aspect of the invention, there provides a method for preparing an active layer, wherein, the active layer is a pentacene layer, which is prepared by a compound of Formula I as a pentacene precursor:

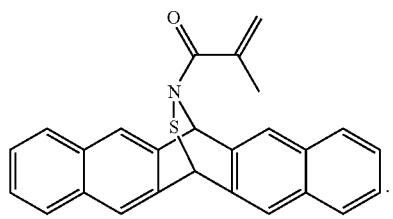

Formula I

The active layer obtained by the preparation method according to the invention is a pentacene layer prepared by a compound of Formula I as a precursor of pentacene. Since the compound of Formula I has a double bond, it can form a polymer under the irradiation of ultraviolet. By using the different dissolvabilities of the polymer and the compound of Formula I in a solvent, the compound of Formula I may be washed out by the solvent so as to realize developing. After developing, pentacene may be generated by heating the polymer. According to the above principle, a photoetching process may be employed to prepare a pentacene layer as an active layer.

According to one embodiment of the preparation method of the invention, the method includes:

coating step: coating a solution of a compound of Formula I to form a layer, and then drying;

photoetching step: coating a photoresist on the layer of the compound of Formula I obtained in the coating step, providing a mask plate and exposing, wherein, the compound of Formula I in the exposed region is converted into a polymer of Formula II;

developing step: developing the polymer of Formula II via an organic solvent after peeling off the photoresist, and washing out the compound of Formula I in the unexposed region;

pentacene generating step: heating the polymer of Formula II in the exposed region to convert it into pentacene

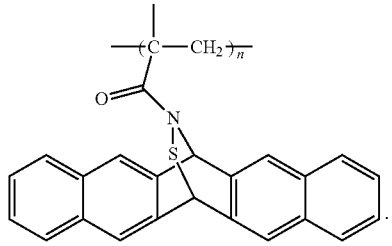

Formula II

In the preparation method according to the invention, a photoetching process is employed, a polymer of Formula II is formed in the exposed region by the compound of Formula I after the photoetching step, and the compound of Formula I is washed out via a developing step, and then the polymer of Formula II is heated to form pentacene. In the preparation method according to the invention, the coffee ring in a pentacene layer prepared by a wet process may be avoided, and the optical property of the organic field-effect transistor may be improved. Additionally, the precision of the active layer formed according to the preparation method is high, and it may be avoided that shape and size of the pentacene layer are changed due to the flowability of the pentacene layer with a solvent obtained via a wet process.

According to one embodiment of the preparation method of the invention, in the coating step, the mass percentage concentration of the solution of the compound of Formula I is in the range from 1.5% to 2.5%. In the coating step, it is difficult to form a film when the mass percentage concentration of the solution of the compound of Formula I is lower than 1.5%, and the film formed will be too thick when it is higher than 2.5%, the optical property is adversely influenced for the above two conditions.

According to one embodiment of the preparation method of the invention, in the coating step, the solvent of the solution of the compound of Formula I is a mixed solvent, wherein the mixed solvent includes, by weight, from 10 to 14 parts of ethylene glycol monobutyl ether, from 70 to 74 parts of γ-butyrolactone and from 14 to 18 parts of N-methyl pyrrolidone. In the preparation method according to the invention, the weight ratio of the mixed solvent selected is easy to dissolve the compound of Formula I, and it is easy for the mixed solvent to be dried after coating.

According to one embodiment of the preparation method of the invention, in the coating step, the drying temperature is in the range from 90 to 100° C., and the drying time is in the range from 98 to 102 seconds. In the preparation method according to the invention, it is not easy to be dried when the drying time is lower than 98 seconds; and when the drying time is higher than 102 seconds, the compound of Formula I tends to directly generate pentacene, thus it will be unable to realize the subsequent photoetching and developing steps.

According to one embodiment of the preparation method of the invention, in the photoetching step, the exposure wavelength is in the range from 300 to 450 nm, and the light quantity accumulated on an area of one square centimeter is in the range from 70 to 130 MJ. Under such a wavelength and accumulated light quantity, the conversion rate from the compound of Formula I to the polymer of Formula II is high.

According to one embodiment of the preparation method of the invention, in the developing step, the organic solvent is trichloromethane, tetrahydrofuran or dioxane. In the preparation method according to the invention, the trichloromethane, tetrahydrofuran or dioxane selected in the developing step as the organic solvent can dissolve the compound of Formula I, but they cannot dissolve the polymer of Formula II, thus the polymer of Formula II in the exposed region may be left, and the compound of Formula I in the unexposed region may be removed, thereby realizing developing.

According to one embodiment of the preparation method of the invention, in the pentacene generating step, the heating temperature is in the range from 175 to 185° C., and the heating time is in the range from 15 to 25 minutes. In the preparation method according to the invention, the conversion rate from the polymer of Formula II to pentacene is high under such a heating temperature and heating time.

According to another aspect of the invention, there provides an active layer obtained according to the preparation method of the invention.

The active layer of the invention is obtained by the preparation method according to the invention, wherein the coffee ring on the pentacene active layer obtained by a wet process may be avoided, and the optical effect of an organic field-effect transistor containing the active layer may be improved. Moreover, the pentacene layer prepared according to method of the invention does not have flowability, and its precision is improved greatly.

According to another aspect of the invention, there provides an organic field-effect transistor, which includes the active layer according to the invention.

The active layer according to the invention is obtained by the preparation method according to the invention, wherein the coffee ring on the pentacene active layer prepared by a wet process may be avoided, and the optical property of an organic field-effect transistor containing the active layer may be improved. Unlike the pentacene layer with a solvent prepared by a wet process, the pentacene layer prepared according to method of the invention does not have flowability, and its precision is improved greatly.

Organic field-effect transistors that contain the pentacene layer prepared according to method of the invention all pertain to the protection scope of the invention. The layer structure and the preparation process of an organic field-effect transistor containing the active layer of the invention are exemplified as follows: a piece of glass is taken as a substrate, a layer of gate metal with a thickness of 2000~3400 Å is sputtered uniformly on the glass substrate, and then a pattern is made on the gate metal layer via a photoetching process to form a gate electrode needed; a silicon nitride passivation layer is manufactured on the gate electrode; an active layer consisted of pentacene is formed on the passivation layer by the preparation method of the invention; and then a source/drain electrode is formed on the active layer, thereby an organic field-effect transistor is formed.

According to another aspect of the invention, there provides an array substrate, which includes the organic field-effect transistor according to the invention.

In the array substrate according to the invention, the coffee ring on the active layer is avoided, and the problem that the pentacene layer with a solvent obtained by a wet process has flowability is avoided, so that the precision of the active layer may be improved.

Array substrates containing the pentacene layer prepared according to method of the invention all pertain to the protection scope of the invention. The layer structure and the preparation process of an array substrate containing the active layer of the invention are exemplified as follows: a piece of glass is taken as a substrate, a layer of gate metal with a thickness of 2000~3400 Å is sputtered uniformly on the glass substrate, and then a pattern is made on the gate metal layer via a photoetching process to form a gate electrode needed; a silicon nitride passivation layer is manufactured on the gate electrode; an active layer consisted of pentacene is formed on the passivation layer by the preparation method of the invention; then a source/drain electrode is formed on the active layer; a layer of ITO (indium tin oxide) with a thickness of 400~800 Å is sputtered uniformly as a pixel electrode on the source/drain electrode formed; a layer of silicon nitride is manufactured on the pixel electrode layer as a dielectric layer; a layer of ITO with a thickness of 400~800 Å is sputtered uniformly on the dielectric layer, and then an ITO electrode is formed by a process of setting a mask plate, exposing and developing, thus an array substrate is obtained.

There exist many selectable factors for the active layer and the method for preparing the same, the organic field-effect transistor and the array substrate according to the invention, and one skilled in the art may assemble different embodiments according to the spirit of the claims of the invention. Therefore, the embodiments below are only given for illustrating the invention, rather than limiting the protection scope of the invention. The method for preparing an active layer according to the invention will be further described below in conjunction with specific embodiments.

Embodiment 1

A method for preparing an active layer of an organic field-effect transistor according to Embodiment 1 is as follows.

First of all, a coating step is performed. That is, a solution of a compound of Formula I is coated to form a layer, and then it is dried. The mass percentage concentration of the solution of the compound of Formula I is 1.5%, and the solvent of the solution is a mixed solvent, which includes, by weight, 10 parts of ethylene glycol monobutyl ether, 70 parts of γ-butyrolactone and 14 parts of N-methyl pyrrolidone. The drying temperature is 90° C., and the drying time is 98 seconds.

Next, a photoetching step is performed. That is, a photoresist is coated on the layer of the compound of Formula I obtained in the coating step, a mask plate is provided and then it is exposed, so that a polymer of Formula II is generated in the exposed region. The exposure wavelength is 300 nm, and the light quantity accumulated on an area of one square centimeter is 70 mj.

Then, a developing step is performed. That is, it is developed the polymer of Formula II via an organic solvent after the photoresist is peeled off, and the compound of Formula I in the unexposed region is washed out. The organic solvent is tetrahydrofuran.

Finally, a pentacene generating step is performed. That is, the polymer of Formula II generated in the exposed region is heated to generate pentacene. The heating temperature is 175° C., and the heating time is 15 minutes. Up to this point, the pentacene generating step ends, and an active layer is formed.

Embodiment 2

A method for preparing an active layer of an organic field-effect transistor according to Embodiment 2 is as follows.

First of all, a coating step is performed. That is, a compound of Formula I is coated to form a layer, and then it is dried. The mass percentage concentration of the solution of the compound of Formula I is 2.5%, and the solvent of the solution is a mixed solvent, which includes, by weight, 14 parts of ethylene glycol monobutyl ether, 74 parts of γ-butyrolactone and 18 parts of N-methyl pyrrolidone. The drying temperature is 100° C., and the drying time is 102 seconds.

Next, a photoetching step is performed. That is, a photoresist is coated on the layer of the compound of Formula I obtained in the coating step, a mask plate is provided and then it is exposed, so that a polymer of Formula II is generated in the exposed region. The exposure wavelength is 450 nm, and the light quantity accumulated on an area of one square centimeter is 130 mj.

Then, a developing step is performed. That is, it is developed the polymer of Formula II via an organic solvent after the photoresist is peeled off, and the compound of Formula I in the unexposed region is washed out. The organic solvent is dioxane.

Finally, a pentacene generating step is performed. That is, the polymer of Formula II generated in the exposed region is heated to generate pentacene. The heating temperature is 185° C., and the heating time is 25 minutes. Up to this point, the pentacene generating step ends, and an active layer is formed.

Embodiment 3

A method for preparing an active layer of an organic field-effect transistor according to Embodiment 3 is as follows.

First of all, a coating step is performed. That is, a solution of a compound of Formula I is coated to form a layer, and then it is dried. The mass percentage concentration of the solution of the compound of Formula I is 2%, and the solvent of the solution is a mixed solvent, which includes, by weight, 12 parts of ethylene glycol monobutyl ether, 73 parts of γ-butyrolactone and 16 parts of N-methyl pyrrolidone. The drying temperature is 95° C., and the drying time is 100 seconds.

Next, a photoetching step is performed. That is, a photoresist is coated on the layer of the compound of Formula I obtained in the coating step, a mask is provided and then it is exposed, so that a polymer of Formula II is generated in the exposed region. The exposure wavelength is 400 nm, and the light quantity accumulated on an area of one square centimeter is 100 mj.

Then, a developing step is performed. That is, it is developed the polymer of Formula II via an organic solvent after the photoresist is peeled off, and the compound of Formula I in the unexposed region is washed out. The organic solvent is trichloromethane.

Finally, a pentacene generating step is performed. That is, the polymer of Formula II generated in the exposed region is heated to generate pentacene. The heating temperature is 180° C., and the heating time is 20 minutes. Up to this point, the pentacene generating step ends, and an active layer is formed.

Embodiment 4

A method for preparing an active layer of an organic field-effect transistor according to Embodiment 4 is as follows.

First of all, a coating step is performed. That is, a solution of a compound of Formula I is coated to form a layer, and then it is dried. The mass percentage concentration of the solution of the compound of Formula I is 2.3%, and the solvent of the solution is a mixed solvent, which includes, by weight, 11 parts of ethylene glycol monobutyl ether, 71 parts of γ-butyrolactone and 15 parts of N-methyl pyrrolidone. The drying temperature is 98° C., and the drying time is 99 seconds.

Next, a photoetching step is performed. That is, a photoresist is coated on the layer of the compound of Formula I, a mask is provided and then it is exposed, so that a polymer of Formula II is generated in the exposed region. The exposure wavelength is 380 nm, and the light quantity accumulated on an area of one square centimeter is 120 mj.

Then, a developing step is performed. That is, it is developed the polymer of Formula II via an organic solvent after the photoresist is peeled off, and the compound of Formula I in the unexposed region is washed out. The organic solvent is trichloromethane.

Finally, a pentacene generating step is performed. That is, the polymer of Formula II generated in the exposed region is heated to generate pentacene. The heating temperature is 178° C., and the heating time is 18 minutes. Up to this point, the pentacene generating step ends, and an active layer is formed.

Embodiment 5

A method for preparing an active layer of an organic field-effect transistor according to Embodiment 5 is as follows.

First of all, a coating step is performed. That is, a solution of a compound of Formula I is coated to form a layer, and then it is dried. The mass percentage concentration of the solution of the compound of Formula I is 1.9%, and the solvent of the solution is a mixed solvent, which includes, by weight, 13 parts of ethylene glycol monobutyl ether, 72 parts of γ-butyrolactone and 16 parts of N-methyl pyrrolidone. The drying temperature is 96° C., and the drying time is 101 seconds.

Next, a photoetching step is performed. That is, a photoresist is coated on the layer of the compound of Formula I, a mask plate is provided and then it is exposed, so that a polymer of Formula II is generated in the exposed region. The exposure wavelength is 430 nm, and the light quantity accumulated on an area of one square centimeter is 125 mj.

Then, a developing step is performed. That is, it is developed the polymer of Formula II via an organic solvent after the photoresist is peeled off, and the compound of Formula I in the unexposed region is washed out. The organic solvent is tetrahydrofuran.

Finally, a pentacene generating step is performed. That is, the polymer of Formula II generated in the exposed region is heated to generate pentacene. The heating temperature is 176° C., and the heating time is 23 minutes. Up to this point, the pentacene generating step ends, and an active layer is formed.

Embodiment 6

A method for preparing an active layer of an organic field-effect transistor according to Embodiment 6 is as follows.

First of all, a coating step is performed. That is, a solution of a compound of Formula I is coated to form a layer, and then it is dried. The mass percentage concentration of the solution of the compound of Formula I is 1.8%, and the solvent of the solution is a mixed solvent, which includes, by weight, 13 parts of ethylene glycol monobutyl ether, 73 parts of γ-butyrolactone and 17 parts of N-methyl pyrrolidone. The drying temperature is 93° C., and the drying time is 100 seconds.

Next, a photoetching step is performed. That is, a photoresist is coated on the layer of the compound of Formula I, a mask plate is provided and then it is exposed, so that a polymer of Formula II is generated in the exposed region. The exposure wavelength is 330 nm, and the light quantity accumulated on an area of one square centimeter is 86 mj.

Then, a developing step is performed. That is, it is developed the polymer of Formula II via an organic solvent after the photoresist is peeled off, and the compound of Formula I in the unexposed region is washed out. The organic solvent is trichloromethane.

Finally, a pentacene generating step is performed. That is, the polymer of Formula II generated in the exposed region is heated to generate pentacene. The heating temperature is 175~185° C., and the heating time is 15~25 minutes. Up to this point, the pentacene generating step ends, and an active layer is formed.

An active layer with good optical effect and high precision, but without coffee ring, is prepared in all of Embodiments 1~6 of the invention. Both organic field-effect transistors and array substrates that contain the active layers prepared in Embodiment 1~6 have good optical effect. The inventors have detected the mobility of the organic field-effect transistors that contain the active layers prepared in Embodiments 1~6, and it can reach 2~3 cm$^2$V$^{-1}$s$^{-1}$, which is considerably higher than the mobility (1 cm$^2$V$^{-1}$s$^{-1}$) of a transistor containing an active layer manufactured by a silicon material. Thus, it can be seen that the mobility of the organic field-effect transistor of the invention is improved greatly.

Apparently, various modifications and variations may be made by one skilled in the art without departing from the spirit and scope of the invention. Thus, if these modifications and variations of the invention fall into the scope of the claims of the invention and their equivalents, the invention intends to encompass these modifications and variations.

What is claimed is:

1. A method for preparing an active layer which is a pentacene layer, wherein the method comprises:
    a coating step of coating a solution of a compound of Formula I as a precursor of pentacene to form a layer, and then drying;

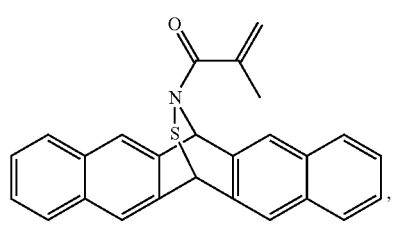

Formula I a photoetching step of coating a photoresist on the layer of the compound of Formula I obtained in the coating step, providing a mask and then exposing, wherein the compound of Formula I in an exposed region is converted into a polymer of Formula II, and in the photoetching step, an exposure wavelength is 300~450 nm, and light quantity accumulated on an area of one square centimeter is 70~130 mj;

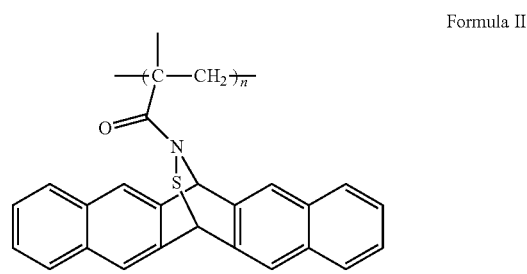

Formula II a developing step of developing the polymer of Formula II via an organic solvent after peeling off the photoresist, and washing out the compound of Formula I in an unexposed region; and a pentacene generating step of heating the polymer of Formula II in the exposed region to convert it into pentacene.

2. The preparation method of claim 1, wherein, in the coating step, a mass percentage concentration of the solution of the compound of Formula I is 1.5~2.5%.

3. The preparation method of claim 1, wherein, in the coating step, the solvent of the solution of the compound of Formula I is a mixed solvent, wherein the mixed solvent comprises, by weight, 10~14 parts of ethylene glycol monobutyl ether, 70~74 parts of γ-butyrolactone and 14~18 parts of N-methyl pyrrolidone.

4. The preparation method of claim 1, wherein, in the coating step, a drying temperature is 90~100° C., and a drying time is 98~102 seconds.

5. The preparation method of claim 1, wherein, in the developing step, the organic solvent is trichloromethane, tetrahydrofuran or dioxane.

6. The preparation method of claim 1, wherein, in the pentacene generating step, a heating temperature is 175~185° C., and a heating time is 15~25 minutes.

7. An active layer, which is obtained by the preparation method of claim 1.

8. The active layer of claim 7, wherein, in the coating step, a mass percentage concentration of the solution of the compound of Formula I is 1.5~2.5%.

9. The active layer of claim 7, wherein, in the coating step, the solvent of the solution of the compound of Formula I is a mixed solvent, wherein, the mixed solvent includes, by weight, 10~14 parts of ethylene glycol monobutyl ether, 70~74 parts of γ-butyrolactone and 14~18 parts of N-methyl pyrrolidone.

10. The active layer of claim 7, wherein, in the coating step, drying temperature is 90~100° C., and drying time is 98~102 seconds.

11. The active layer of claim 7, wherein, in the developing step, the organic solvent is trichloromethane, tetrahydrofuran or dioxane.

12. The active layer of claim 7, wherein, in the pentacene generating step, the heating temperature is 175~185° C., and the heating time is 15~25 minutes.

13. An organic field-effect transistor, which comprises the active layer of claim 7.

14. An array substrate, wherein, the array substrate comprises the organic field-effect transistor of claim 13.

* * * * *